United States Patent
Orii et al.

(10) Patent No.: US 7,691,210 B2
(45) Date of Patent: Apr. 6, 2010

(54) RESIST FILM REMOVING METHOD

(75) Inventors: Takehiko Orii, Nirasaki (JP); Kenji Sekiguchi, Nirasaki (JP); Tadashi Iino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 546 days.

(21) Appl. No.: 11/543,819

(22) Filed: Oct. 6, 2006

(65) Prior Publication Data
US 2007/0082496 A1    Apr. 12, 2007

(30) Foreign Application Priority Data
Oct. 11, 2005   (JP) ............... 2005-296632

(51) Int. Cl.
*B08B 3/00* (2006.01)

(52) U.S. Cl. ............... 134/30; 134/4; 134/18; 134/19; 134/26; 134/42

(58) Field of Classification Search ............... 134/18, 134/42, 19, 26, 4, 30
See application file for complete search history.

(56) References Cited

U.S. PATENT DOCUMENTS 6,605,343 B1 * 8/2003 Motoi et al. ............ 428/298.1

2001/0012971 A1 * 8/2001 Nguyen ................ 700/121

FOREIGN PATENT DOCUMENTS

| JP | 07-037780 | | 2/1995 |
| JP | 07045510 A | * | 2/1995 |
| JP | 2001-093806 | | 4/2001 |
| JP | 2004327527 A | * | 11/2004 |
| JP | 2004327537 A | * | 11/2004 |

OTHER PUBLICATIONS

Machine Translation: JP 07-045510 to Hasegawa, et al. Feb. 1995.*
Machine Translation: JP 2004-327537 to Hashimoto. Nov. 2004.*
Machine Translation: JP 2004-327537 to Ono et al. Nov. 2004.*

* cited by examiner

*Primary Examiner*—Michael Kornakov
*Assistant Examiner*—Naomi Birbach
(74) *Attorney, Agent, or Firm*—Smith, Gambrell & Russell, LLP

(57) ABSTRACT

A resist film removing method for removing a resist film disposed on a substrate and having a cured layer at a surface includes covering the surface of the resist film with a protection film; causing popping in the resist film covered with the protection film; denaturing the resist film and the protection film after causing popping, to be soluble in water; and performing purified water cleaning to remove from the substrate the resist film and the protection film denatured to be soluble in water.

12 Claims, 9 Drawing Sheets

RESIST FILM REMOVING METHOD

BACKGROUND OF THE INVENTION

1. Field of the Invention

The present invention relates to a resist film removing method for removing from a substrate a resist film having a surface cured by a process, such as an ion implantation process or etching process. The present invention also relates to a computer readable storage medium that stores a control program for executing a method of this kind.

2. Description of the Related Art

In manufacturing semiconductor devices, ion implantation techniques are utilized to implant predetermined ions into a semiconductor wafer made of a silicon substrate, and various films, such as an insulating film, disposed on the surface of a silicon substrate, so as to change their surface property. For example, a p-n junction can be formed in a substrate by implanting ions of, e.g., arsenic (As), phosphorous (P), and/or boron (B) into the substrate.

In general, an ion implantation process is performed after a resist film having a predetermined circuit pattern is formed on a substrate (which means an underlying material present under the resist film, such as a silicon substrate or one of various films disposed on the surface of the silicon substrate or the like). The resist film is removed after the ion implantation process. In this respect, where the resist film is used for ion implantation of a high concentration, a less-strippable cured layer is formed on the surface of the resist film, so it becomes difficult to peel off the resist film from the substrate. Accordingly, in general, where a resist film with a cured layer formed at the surface is removed, a method is adopted such that a plasma ashing process is first performed on the resist film, and a wet cleaning is then performed on the substrate (for example, Jpn. Pat. Appln. KOKAI Publication No. 7-37780).

However, the substrate may be damaged due to the plasma ashing process performed on the resist film. For example, the substrate may be oxidized by implanted ions, the ashing gas may be introduced into the substrate to change its property due to anisotropy of the plasma ashing, or an electric discharge may be caused from the substrate charged with electricity by the plasma ashing.

Further, when the plasma ashing process is performed on the resist film, the resist film is heated and generates gases from the inside, such as gasified solvent components and/or nitrogen gas ($N_2$). Consequently, a phenomenon, so-called popping, occurs such that the gases break the cured layer of the resist film and spurt therefrom, thereby blowing out the resist film. This popping occurs because the temperature of a heating process performed subsequently to the resist film development process is lower than the temperature of the plasma ashing process performed thereafter. In this case, a non-cured state (a state having viscosity), which is substantially unchanged between before and after an ion implantation process, is present inside the resist film, in which a component that can be vaporized by heat applied during the plasma ashing process is remaining. If popping occurs, droplets of the non-cured part may be scattered from the exploded resist film and deposited on the substrate. If the droplets are deposited on the substrate, it is difficult to remove them by wet cleaning of the substrate.

In order to solve the problem described above, the following approach has been adopted in place of the plasma ashing process (for example, Jpn. Pat. Appln. KOKAI Publication No. 2001-93806). Specifically, water is supplied onto a resist film while a substrate therebelow is heated to generate cracks in a cured layer of the resist film. In this case, the water is allowed to permeate through the cracks into the resist film up to the boundary between the resist film and substrate. Consequently, the resist film is peeled off from the substrate, or set to be easily peeled off from the substrate.

However, in the case of the technique according to Jpn. Pat. Appln. KOKAI Publication No. 2001-93806, it is necessary to generate a lot of cracks in the cured layer of the resist film, so as to effectively remove the resist film. If the heating temperature is set higher for this purpose, the resist film may cause popping, thereby allowing droplets of a non-cured part to be scattered onto the substrate. Accordingly, this technique is tolerant of crack generation only to the extent that does not entail popping of the resist film, resulting in difficulty in sufficiently removing the resist film.

BRIEF SUMMARY OF THE INVENTION

An object of the present invention is to provide a resist film removing method that allows a resist film having a less-strippable cured layer at the surface to be effectively removed from a substrate without damaging the substrate.

Another object of the present invention is to provide a computer readable storage medium that stores a control program for executing a method of this kind.

According to a first aspect of the present invention, there is provided a resist film removing method for removing a resist film disposed on a substrate and having a cured layer at a surface, the method comprising: covering the surface of the resist film with a protection film; causing popping in the resist film covered with the protection film; and removing the resist film and the protection film from the substrate by a predetermined liquid after said causing popping.

In the first aspect of the present invention, said removing the resist film and the protection film may comprise denaturing the resist film and the protection film after said causing popping, to be soluble in water or an organic solvent, and then dissolving the resist film and the protection film by water or the organic solvent. A process using a process gas containing water vapor and ozone may be performed on the resist film and the protection film in said denaturing the resist film and the protection film after said causing popping. The process using a process gas containing water vapor and ozone may be performed in a state where the substrate is placed in an airtight chamber and a positive pressure is maintained inside the airtight chamber.

In the first aspect of the present invention, the protection film preferably comprises an elastic resin.

According to a second aspect of the present invention, there is provided a resist film removing method for removing a resist film disposed on a substrate and having a cured layer at a surface, the method comprising: covering the surface of the resist film with a thermally shrinkable shrink material; shrinking the shrink material by heating, thereby generating cracks in the cured layer of the resist film covered with the shrink material; and removing the resist film and the shrink material from the substrate by a predetermined liquid after said generating cracks.

In the second aspect of the present invention, said removing the resist film and the shrink material may comprise denaturing the resist film and the shrink material after said generating cracks, to be soluble in water or an organic solvent, and then dissolving the resist film and the shrink material by water or the organic solvent. A process using a process gas containing water vapor and ozone may be performed on the resist film and the shrink material in said denaturing the resist film and the shrink material after said generating cracks. The process using a process gas containing water vapor and ozone may be performed in a state where the substrate is placed in an airtight chamber and a positive pressure is maintained inside the airtight chamber.

In the second aspect of the present invention, said generating cracks may comprise causing popping in the resist film covered with the shrink material.

According to a third aspect of the present invention, there is provided a resist film removing method for removing a resist film disposed on a substrate and having a cured layer at a surface, the method comprising: covering the surface of the resist film with a softening material capable of softening the cured layer of the resist film; softening the cured layer of the resist film covered with the softening material, under an action of the softening material; and removing the resist film and the softening material from the substrate by a predetermined liquid after said softening.

In the third aspect of the present invention, said removing the resist film and the softening material may comprise denaturing the resist film and the softening material after said softening, to be soluble in water or an organic solvent, and then dissolving the resist film and the softening material by water or the organic solvent. A process using a process gas containing water vapor and ozone may be performed on the resist film and the softening material in said denaturing the resist film and the softening material after said softening. The process using a process gas containing water vapor and ozone may be performed in a state where the substrate is placed in an airtight chamber and a positive pressure is maintained inside the airtight chamber.

In the third aspect of the present invention, the softening material may have a property such that, when the softening material is in contact with the cured layer of the resist film and heated, the softening material reacts with an acid generated from the cured layer, thereby softening the cured layer, and said softening the cured layer may comprise heating the softening material.

The method according to each of the first, second, and third aspects of the present invention is effective in a case where the cured layer is a layer formed by ion implantation.

According to a fourth aspect of the present invention, there is provided a computer readable storage medium that stores a control program for execution on a computer, wherein the control program, when executed, causes the computer to control a processing apparatus to conduct a resist film removing method for removing a resist film disposed on a substrate and having a cured layer at a surface, the method comprising: covering the surface of the resist film with a protection film; causing popping in the resist film covered with the protection film; and removing the resist film and the protection film from the substrate by a predetermined liquid after said causing popping.

According to a fifth aspect of the present invention, there is provided a computer readable storage medium that stores a control program for execution on a computer, wherein the control program, when executed, causes the computer to control a processing apparatus to conduct a resist film removing method for removing a resist film disposed on a substrate and having a cured layer at a surface, the method comprising: covering the surface of the resist film with a thermally shrinkable shrink material; shrinking the shrink material by heating, thereby generating cracks in the cured layer of the resist film covered with the shrink material; and removing the resist film and the shrink material from the substrate by a predetermined liquid after said generating cracks.

According to a sixth aspect of the present invention, there is provided a computer readable storage medium that stores a control program for execution on a computer, wherein the control program, when executed, causes the computer to control a processing apparatus to conduct a resist film removing method for removing a resist film disposed on a substrate and having a cured layer at a surface, the method comprising: covering the surface of the resist film with a softening material capable of softening the cured layer of the resist film; softening the cured layer of the resist film covered with the softening material, under an action of the softening material; and removing the resist film and the softening material from the substrate by a predetermined liquid after said softening.

According to the first aspect of the present invention, a resist film having a cured layer at a surface is covered with a protection film, and then popping is caused in the resist film while it is covered with the protection film. With this arrangement, the cured layer can be widely broken to effectively improve the liquid permeability of the resist film, while droplets of a non-cured part inside the resist film are prevented from being scattered onto the substrate and the substrate is prevented from being damaged. Consequently, it is possible to effectively remove the resist film from the substrate by a predetermined liquid.

According to the second aspect of the present invention, a resist film having a cured layer at a surface is covered with a thermally shrinkable shrink material, and then the shrink material is shrunk by heating to generate cracks in the cured layer of the resist film. With this arrangement, the cured layer can be widely broken to effectively improve the liquid permeability of the resist film, while droplets of a non-cured part inside the resist film are prevented from being scattered onto the substrate and the substrate is prevented from being damaged. Consequently, it is possible to effectively remove the resist film from the substrate by a predetermined liquid.

According to the third aspect of the present invention, a resist film having a cured layer at a surface is covered with a softening material capable of softening the cured layer, and then the cured layer is softened in this sate. With this arrangement, the liquid permeability of the resist film can be effectively improved, while droplets of a non-cured part inside the resist film are prevented from being scattered onto the substrate and the substrate is prevented from being damaged. Consequently, it is possible to effectively remove the resist film from the substrate by a predetermined liquid.

DETAILED DESCRIPTION OF THE INVENTION

Embodiments of the present invention will now be described with reference to the accompanying drawings.

FIGS. 1A to 1E are views schematically showing steps of a resist film removing method according to an embodiment of the present invention.

Figure 1A:
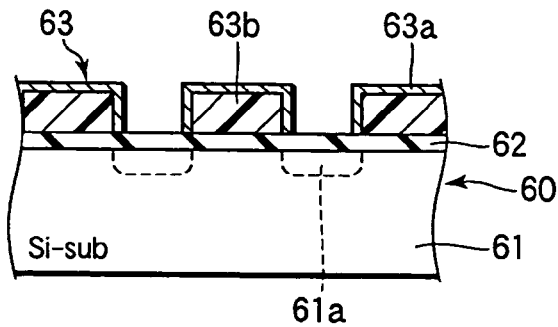
FIGS. 1A to 1E are views schematically showing steps of a resist film removing method according to an embodiment of the present invention.

FIG. 1A shows a state where ion implantation has been performed to form impurity diffusion regions 61a in the main surface of a silicon wafer 61, in the process of manufacturing a semiconductor device. A reference symbol 62 indicates an insulating film formed on the silicon wafer 61, and a reference symbol 63 indicates a resist film formed on the insulating film 62 and used as a mask for the ion implantation. The resist film 63 has been subjected to a light exposure process and a development process, and then to a heating process, before the ion implantation process. A cured layer 63a formed by the ion implantation process of a high concentration is present at the surface of the resist film 63, but a non-cured state (which will be referred to as a non-cured part) 63b is present inside the resist film 63. The silicon wafer 61 and insulating film 62 constitute a substrate 60 serving as an underlying material of the resist film 63.

Figure 1B:
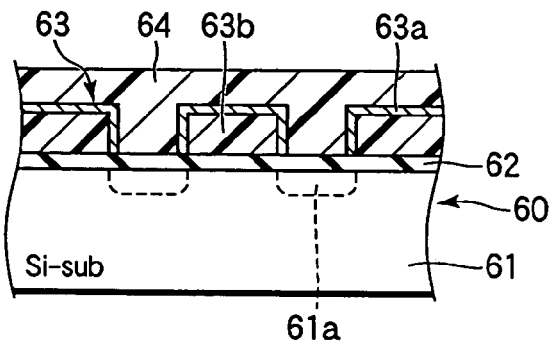

In this embodiment, when the resist film 63 is removed, as shown in FIG. 1B, a protection film 64 is formed on the surface of the resist film 63 to cover the surface of the substrate 60 (insulating film 62), for example (Step 1). The protection film 64 is made of an elastic resin material, such as a silicon-containing resist. The protection film 64 is preferably formed to be as thin as possible, so as to be easily removed, but needs to have a film thickness that can prevent droplets of the resist film 63 from bursting therethrough when popping is caused, as described later.

Figure 1C:
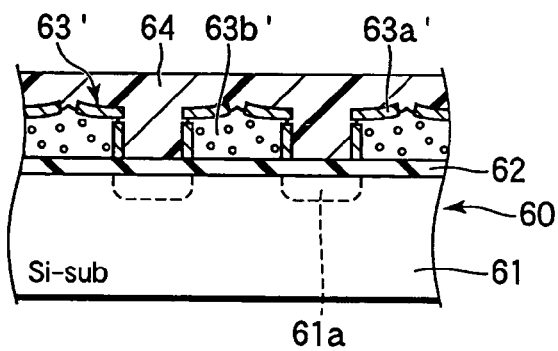

Then, as shown in FIG. 1C, the resist film 63 is heated to cause popping in the resist film 63 covered with the protection film 64 (Step 2). Reference symbols 63', 63a', and 63b' indicate the resist film, cured layer, and non-cured part, respectively, obtained after the popping is caused. As described above, this popping occurs such that portions of the non-cured part 63b inside the resist film 63 burst through the cured layer 63 and spurt therefrom, because the resist film 63 is heated at a temperature higher than that of a heating process (post baking) following the development process.

Figure 1D:
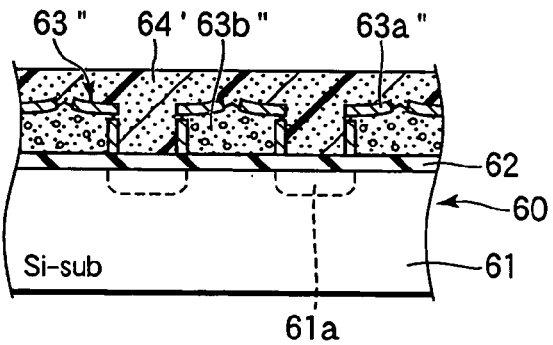

Subsequently, as shown in FIG. 1D, a process gas containing water vapor and ozone is supplied and brought into contact with the resist film 63' and protection film 64 after the popping is caused, so that the after-popping resist film 63' and protection film 64 are denatured to be soluble in water (or soluble in an organic solvent), (Step 3). Reference symbols 63", 63a", 63b", and 64' indicate the resist film, cured layer, non-cured part, and protection film, respectively, obtained after they are denatured to be soluble in water.

Figure 1E:
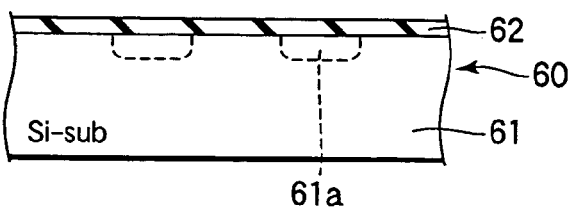

Then, as shown in FIG. 1E, the resist film 63" and protection film 64' denatured to be soluble in water are dissolved and removed from the substrate 60 by purified water cleaning (Step 4). In place of purified water, another aqueous cleaning liquid or organic solvent may be used to remove the resist film 63" and protection film 64'.

As described above, unlike the conventional resist film removing method, this embodiment does not utilize ashing, such as plasma ashing, so the substrate 60 is prevented from being damaged. Further, popping is caused in the resist film 63 while it is covered with the protection film 64, so droplets of the non-cured part 63b of the resist film 63 are prevented from being scattered onto the substrate 60. This allows the popping to be caused more furiously, so that the cured layer 63a of the resist film 63 is broken more widely. In addition, even after the popping, the non-cured part 63b' is prevented by the protection film 64 from coming into contact with the atmosphere, and thereby prevented from being cured after the popping. Accordingly, after the popping, the process gas is allowed to permeate into the resist film 63' up to the boundary between the resist film 63' and substrate 60, and to thereby denature the resist film 63' into the water soluble resist film 63". Then, the resist film 63" can be completely removed from the substrate 60 by the subsequent purified water cleaning. In general, resist films are cured strongly by ion implantation at a high dosage of $1 \times 10^{15}$ atoms/cm$^2$ or more. Accordingly, this embodiment is particularly effective in removing a resist film used for ion implantation at such a high dosage.

After Step 2 described above, in place of Steps 3 and 4 described above, an SPM chemical solution containing sulfuric acid and hydrogen peroxide solution may be used to remove the resist film 63' and protection film 64 from the substrate 60 after the popping is caused (Step 3b). Also in this case, after the popping is caused, the SPM chemical solution is allowed to permeate into the resist film 63' up to the boundary between the resist film 63' and substrate 60, so the resist film 63' can be completely dissolved and removed from the substrate 60.

Next, a detailed explanation will be given of exemplary apparatuses for performing the series of processes, and operations of the apparatuses in performing Steps described above.

Figure 2:
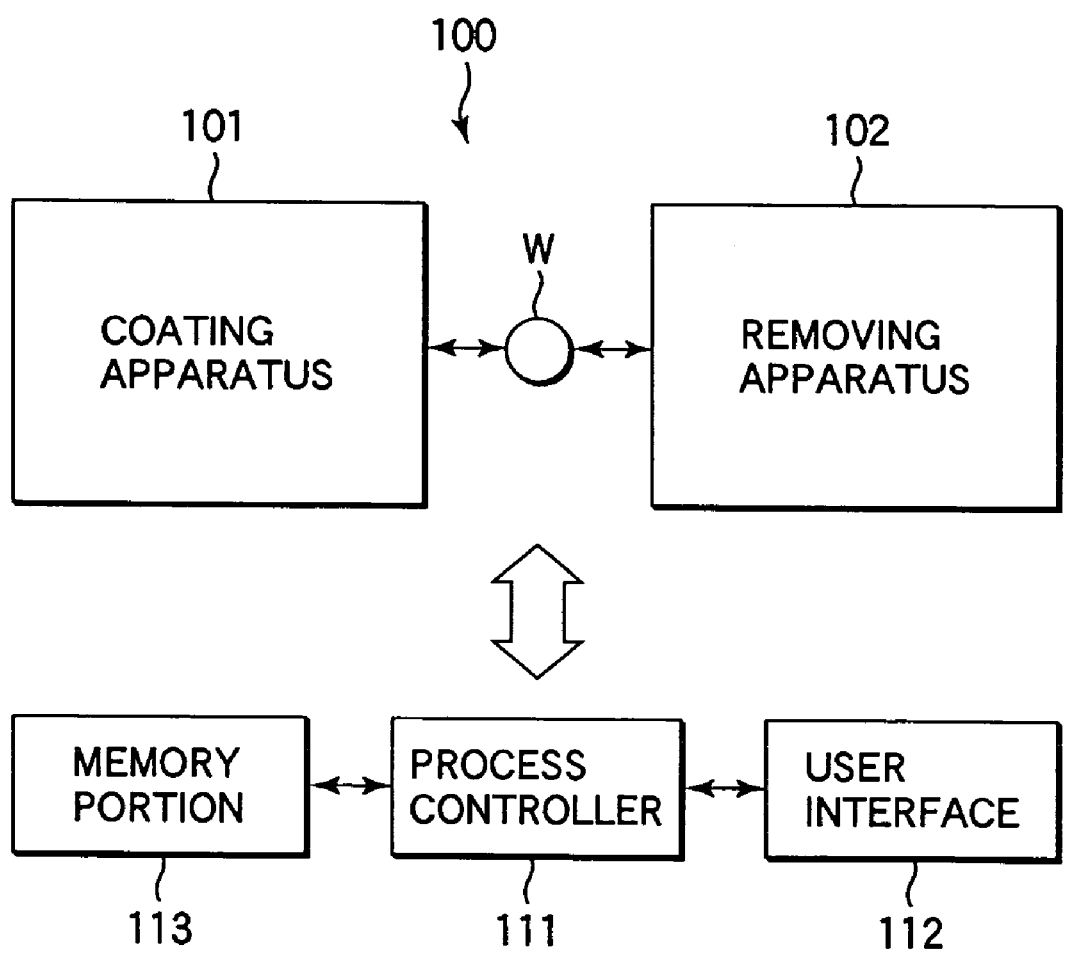
FIG. 2 is a block diagram schematically showing the structure of a substrate processing system for performing a resist film removing method according to the present invention.

FIG. 2 is a block diagram schematically showing the structure of a substrate processing system for performing a resist film removing method according to the present invention.

The substrate processing system 100 includes a coating apparatus 101 for forming a protection film and so forth on a wafer W (substrate 60) by coating, and a removing apparatus 102 for removing a resist film, a protection film, and so forth from a wafer W. A transfer unit (not shown) is used for transferring a wafer W between the apparatuses.

The coating apparatus 101 and the removing apparatus 102 in the substrate processing system 100 are connected to and controlled by the process controller 111 having a CPU. The process controller 111 is connected to the user interface 112, which includes, e.g., a keyboard and a display, wherein the keyboard is used for a process operator to input commands for operating the apparatuses in the substrate processing system 100, and the display is used for showing visualized images of the operational status of the apparatuses in the substrate processing system 100. Further, the process controller 111 is connected to the memory portion 113, which stores recipes with control programs and process condition data recorded therein, for realizing various processes performed in the substrate processing system 100 under the control of the process controller 111.

A required recipe is retrieved from the memory portion 113 and executed by the process controller 111 in accordance with an instruction or the like through the user interface 112. Consequently, each of various predetermined processes is performed in the substrate processing system 100 under the control of the process controller 111. Recipes may be stored in a readable memory medium, such as a CD-ROM, hard disk, flexible disk, or nonvolatile memory. Further, recipes may be utilized on-line, while it is transmitted among the respective apparatuses in the substrate processing system 100, or transmitted from an external apparatus through, e.g., a dedicated line, as needed.

In place of the global control by the main control section 110, or along with the global control by the main control section 110, each of the apparatuses in the substrate processing system 100 may be provided with and controlled by its own control section including a process controller, a user interface, and a memory portion.

The coating apparatus 101 is formed of, e.g., a spin coater similar to that for forming the resist film 63 on a wafer W by coating. The coating apparatus 101 is used to form, by spin coating, the protection film 64, or a shrink film 65 (see FIG. 8) or softening film 66 (see FIG. 9) described later to cover the resist film 63 (the structure of the coating apparatus 101 is not shown in detail).

Figure 3:
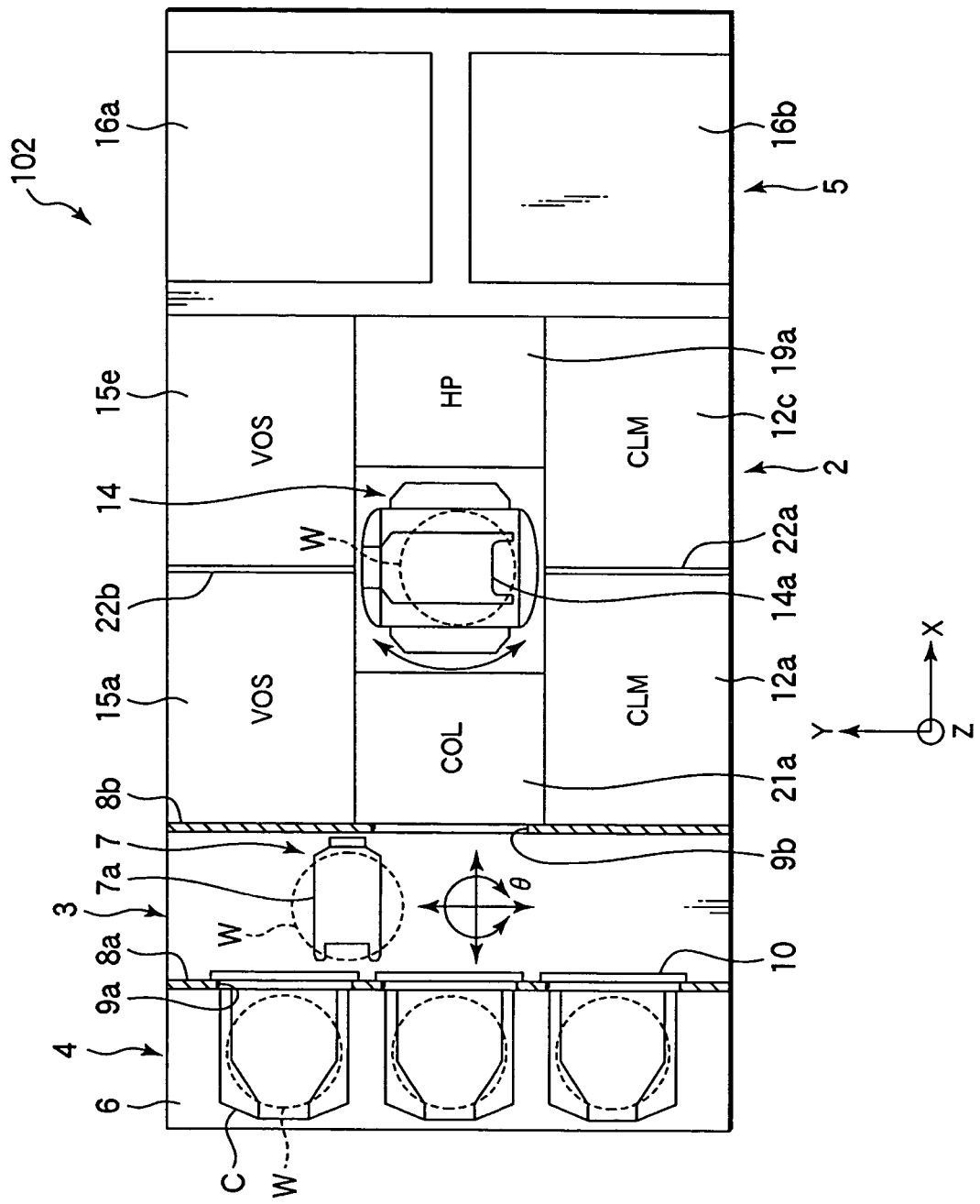
FIG. 3 is a plan view schematically showing a removing apparatus used in the substrate processing system.
Figure 4:
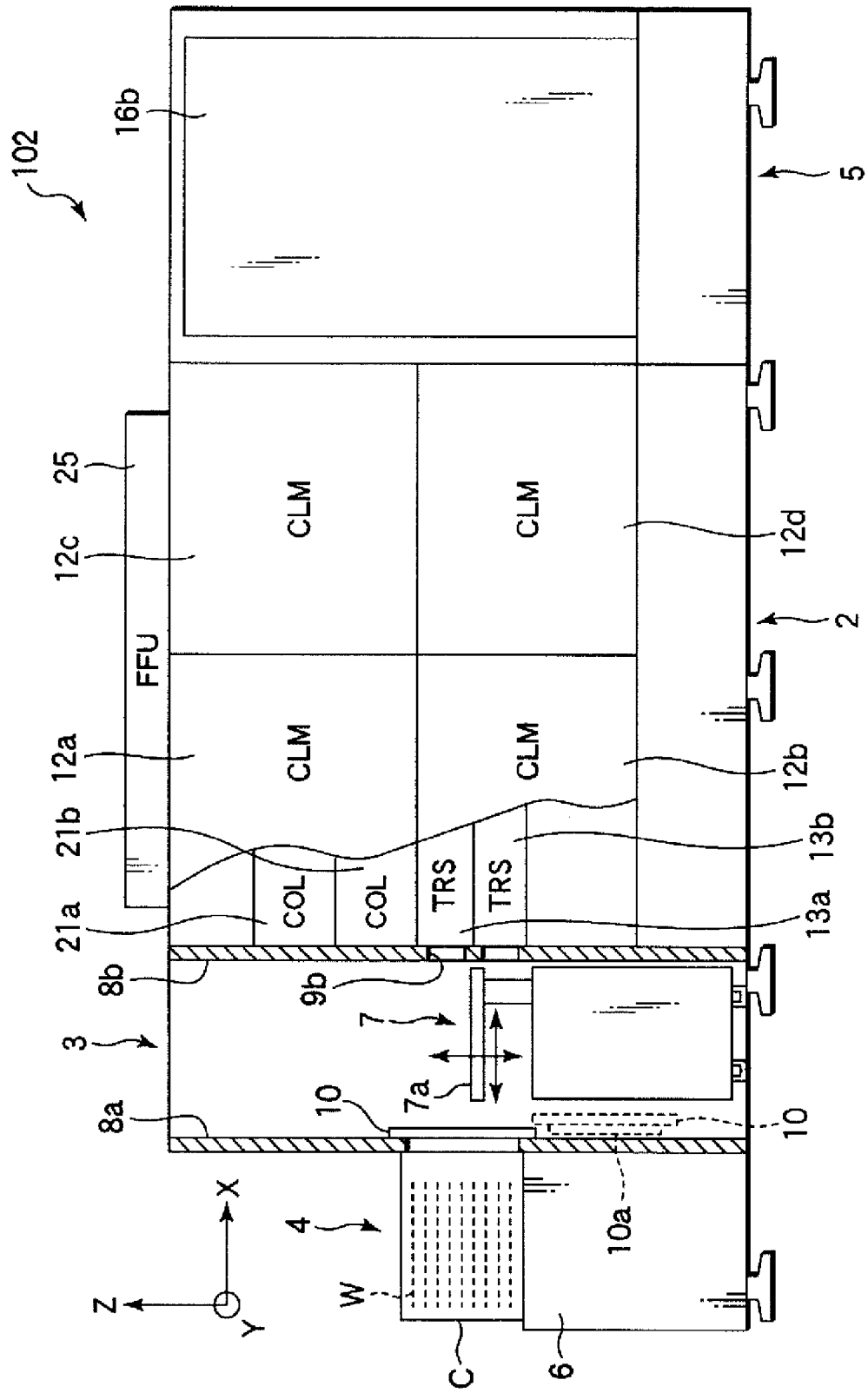
FIG. 4 is a front view schematically showing the removing apparatus used in the substrate processing system.
Figure 5:
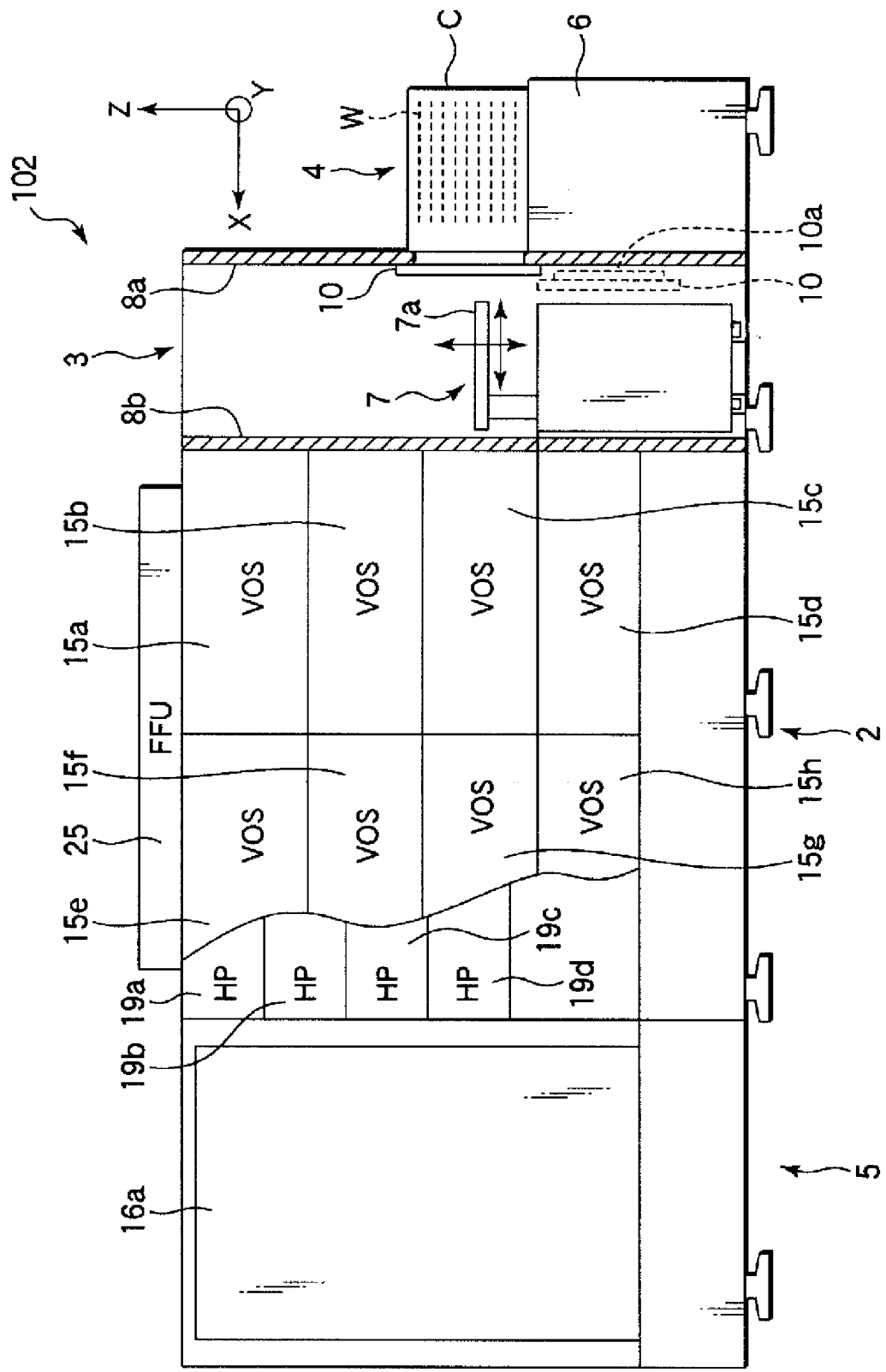
FIG. 5 is a back view schematically showing the removing apparatus used in the substrate processing system.

Next, a detailed explanation will be given of the removing apparatus 102, which plays an important part of the present invention. FIGS. 3, 4, and 5 are a plan view, a front view, and a back view, respectively, schematically showing the removing apparatus 102. The removing apparatus 102 includes a carrier station 4, a process station 2, a transfer station 3, and a chemical station 5. The carrier station 4 is arranged such that carriers each storing wafers W are sequentially transferred from the coating apparatus 101 onto the carrier station 4. The carrier station 4 is also arranged such that carriers each storing wafers W processed in the removing apparatus 102 are transferred from the carrier station 4 to processing apparatuses for subsequent processes. The process station 2 includes a plurality of process units arranged to respectively perform a cleaning process, a denaturing process, and a recovery process. The transfer station 3 is arranged to transfer a wafer W between the process station 2 and carrier station 4. The chemical station 5 is arranged to perform manufacture, preparation, and storage of a chemical liquid, purified water, gas, and so forth to be used in the process station 2.

Each carrier C contains therein wafers W essentially in a horizontal state at regular intervals in the vertical direction (Z-direction). The wafers W are transferred to and from the carrier C through one side of the carrier C, which is opened/closed by a lid 10a (which is not shown in FIG. 3, but shown in FIGS. 4 and 5 in a detached state).

As shown in FIG. 3, the carrier station 4 has a table 6 on which carriers C can be placed at three positions arrayed in a Y-direction defined in FIG. 3. Each carrier C is placed on the table 6 such that the side provided with the lid 10a faces a partition wall 8a between the carrier station 4 and transfer station 3. The partition wall 8a has window portions 9a formed therein at positions corresponding to the mount positions for carriers C. Each of the window portions 9a is provided with a shutter 10 on the transfer station 3 side to open/close the window portion 9a. This shutter 10 includes holding means (not shown) for holding the lid 10a of a carrier C, so that the holding means can hold the lid 10a and withdraw it into the transfer station 3, as shown in FIGS. 4 and 5.

The transfer station 3 is provided with a wafer transfer unit 7 disposed therein, which has a wafer transfer pick 7a for holding a wafer W. The wafer transfer unit 7 is movable in the Y-direction along guides 7b (see FIGS. 4 and 5) extending on the floor of the transfer station 3 in the Y-direction. The wafer transfer pick 7a is slidable in an X-direction, movable up and down in the Z-direction, and rotatable in the X-Y plane (θ rotation).

With the arrangement described above, the wafer transfer pick 7a can access any one of the carriers C placed on the table 6, in a state where the shutters 10 are retreated to allow the interior of the carriers C to communicate with the transfer station 3 through the window portions 9a. Accordingly, the wafer transfer pick 7a can transfer a wafer W from any height position in each of the carriers C, and can transfer a wafer W onto any height position in each of the carriers C.

The process station 2 includes two wafer mount units (TRS) 13a and 13b on the transfer station 3 side. For example, the wafer mount unit (TRS) 13b is used to place a wafer W when the wafer W is transferred from the transfer station 3 to the process station 2. The wafer mount unit (TRS) 13a is used to place a wafer W when the wafer W is returned to the transfer station 3 after it is subjected to a predetermined process in the process station 2.

A partition wall 8b is disposed between the transfer station 3 and process station 2, and has a window portion 9b formed therein at a position corresponding to the wafer mount units (TRS) 13a and 13b. The wafer transfer pick 7a of the wafer transfer unit 7 disposed in the transfer station 3 can access the wafer mount units (TRS) 13a and 13b through the window portion 9b to transfer a wafer W between the carriers C and wafer mount units (TRS) 13a and 13b.

In the process station 2, four hot plate units (HP) 19a to 19d are stacked at a position on the chemical station 5 side opposite to the wafer mount units (TRS) 13a and 13b with a main wafer transfer unit 14 described later interposed therebetween. The hot plate units (HP) 19a to 19d are used to heat a wafer W so as to cause popping in a resist film on the wafer W, and are also used to heat and dry a wafer W treated by the cleaning/chemical-solution processing units (CLM) 12a to 12d described later. Further, cooling plate units (COL) 21a and 21b are stacked on the wafer mount unit (TRS) 13a, and are used to cool a wafer W treated by the heat and dry process. The wafer mount unit (TRS) 13b may be arranged as a cooling plate unit (COL).

A fan and filter unit (FFU) 25 is disposed at the top of the process station 2, and is arranged to send clean air into the process station 2 as a downflow. With this arrangement, a processed wafer W placed in the upper wafer mount unit (TRS) 13a is prevented from being contaminated.

On the rear side of the process station 2, there are denaturing units (VOS) 15a to 15h arrayed in two rows each including four units stacked one on the other. The denaturing units (VOS) 15a to 15h are used to denature a resist film on a wafer W by a process gas containing water vapor and ozone ($O_3$) to be soluble in water, after the resist film is subjected to the popping generation process by the hot plate units (HP) 19a to 19d.

On the front side of the process station 2, there are cleaning/chemical-solution processing units (CLM) 12a to 12d arrayed in two rows each including two units stacked one on the other. The cleaning/chemical-solution processing units (CLM) 12a to 12d are used to perform purified water cleaning on a wafer W treated by the denaturing units (VOS) 15a to 15f, so as to remove a denatured resist film from the wafer W, and are also used to perform chemical solution cleaning on a wafer W treated by the popping generation process in the hot plate units (HP) 19a to 19d, so as to remove a resist film from the wafer W.

The main wafer transfer unit 14 is disposed at the center of the process station 2, and has a wafer transfer arm 14a for transferring a wafer W within the process station 2. The main wafer transfer unit 14 is rotatable about a Z-axis. Further, the wafer transfer arm 14a of the main wafer transfer unit 14 is movable back and forth in a horizontal direction, and movable up and down in the Z-direction. With this arrangement, the wafer transfer arm 14a can access the respective units disposed in the process station 2 to transfer a wafer W between the units.

The chemical station 5 includes a gas supply portion 16a, and a cleaning liquid/chemical solution supply portion 16b.

The gas supply portion 16a is arranged to supply predetermined gases respectively to the denaturing units (VOS) 15a to 15h and cleaning/chemical-solution processing units (CLM) 12a to 12d. The cleaning liquid/chemical solution supply portion 16b is arranged to store purified water and various chemical solutions and to supply these liquids to the cleaning/chemical-solution processing units (CLM) 12a to 12d.

Figure 6:
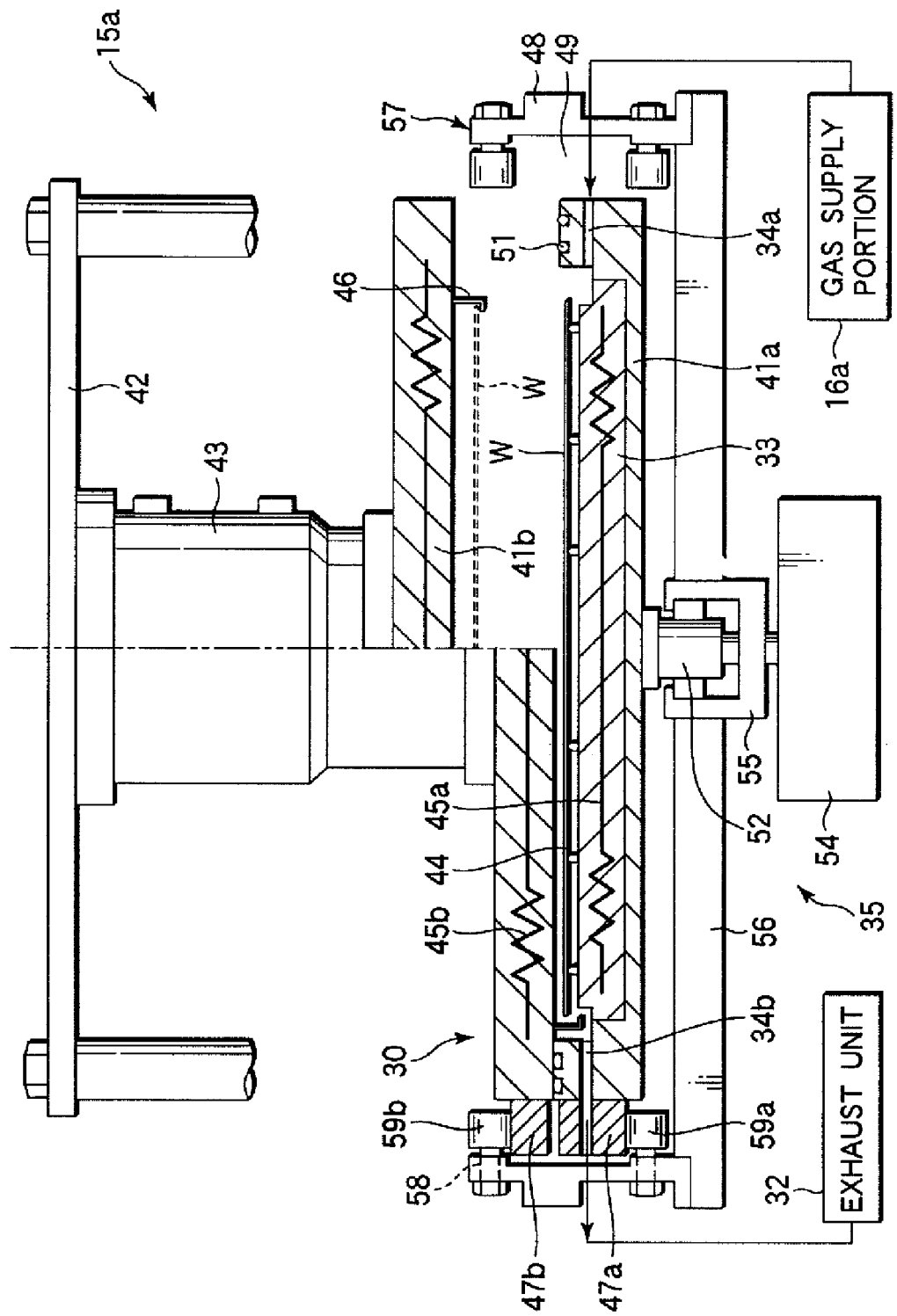
FIG. 6 is a sectional view schematically showing a denaturing unit (VOS) disposed in the removing apparatus.

Next, a detailed explanation will be given of the structure of the denaturing unit (VOS) 15a with reference to the schematic sectional view shown in FIG. 6. The other denaturing units have exactly the same structure. This denaturing unit (VOS) 15a includes an airtight chamber 30 for accommodating a wafer W. The chamber 30 is formed of a stationary lower container 41a, and a lid 41b that covers the top face of the lower container 41a. The lid 41b is movable up and down by a cylinder 43 fixed to a frame 42 of the film denaturing unit (VOS) 15a. FIG. 6 shows both of a state where the lid 41b is in close contact with the lower container 41a, and a state where the lid 41b is retreated above the lower container 41a.

The lower container 41a is provided with an O-ring 51 disposed on the top face of a raised portion at the rim. When the lid 41b is moved down by the cylinder 43, the rim of the bottom face of the lid 41b comes into contact with the top face of the raised portion at the rim of the lower container 41a and presses the O-ring 51 to form an airtight process space in the chamber 30.

The lower container 41a includes a stage 33 for placing a wafer W thereon. The stage 33 is provided with proximity pins 44 at a plurality of positions to support the wafer W.

The stage 33 includes a heater 45a built therein, and the lid 41b includes a heater 45b built therein, so that each of the stage 33 and lid 41b is maintained at a predetermined temperature. Consequently, the temperature of a wafer W can be kept constant.

The lid 41b has hook members 46 at, e.g., three positions (only two of them are shown in FIG. 6) on the bottom face to hold a wafer W. The wafer W is transferred to and from the hook members 46 by the wafer transfer arm 14a. When the lid 41b is moved down while a wafer W is supported by the hook members 46, the wafer W is transferred onto the proximity pins 44 provided on the stage 33, on the way.

The lower container 41a has a gas feed port 34a for supplying a process gas into the chamber 30, and a gas exhaust port 34b for exhausting the process gas out of the chamber 30. The gas feed port 34a is connected to the process gas supply unit 16, and the gas exhaust port 34b is connected to an exhaust unit 32.

When a wafer W is processed by a process gas, the pressure inside the chamber 30 is preferably maintained at a constant positive pressure. For this purpose, the lower container 41a and lid 41b is supplied with not only a pressing force by the cylinder 43, but also a clamping force by a lock mechanism 35 through projecting portions 47a and 47b respectively disposed on end sides of the lower container 41a and lid 41b.

The lock mechanism 35 includes a support shaft 52, a rotary tube 55 rotatable by a rotator unit 54, a circular plate 56 fixed to the rotary tube 55, and pinching devices 57 disposed at the rim of the circular plate 56. Each of the pinching devices 57 includes press rollers 59a and 59b and a roller holding member 48 which holds rotary shafts 58.

The projecting portions 47a and 47b are equidistantly disposed at four positions, between which gap portions 49 are defined. The projecting portions 47a and 47b of each set are disposed at positions overlapping with each other. When the pinching devices 57 are positioned in the gap portions 49, the lid 41b can be freely moved up and down.

When the circular plate 56 is rotated along with the rotary tube 55 by a predetermined angle, the press rollers 59b are stopped at the top faces of the projecting portions 47b, while the press rollers 59a are stopped under the projecting portions 47a.

Next, a detailed explanation will be given of the structure of the cleaning/chemical-solution processing unit (CLM) 12a. The other cleaning/chemical-solution processing units (CLM) 12b to 12d have exactly the same structure as the cleaning/chemical-solution processing unit (CLM) 12a. The cleaning/chemical-solution processing units (CLM) 12a and 12b and cleaning/chemical-solution processing units (CLM) 12c and 12d have structures essentially symmetric with respect to the partition wall 22a.

Figure 7:
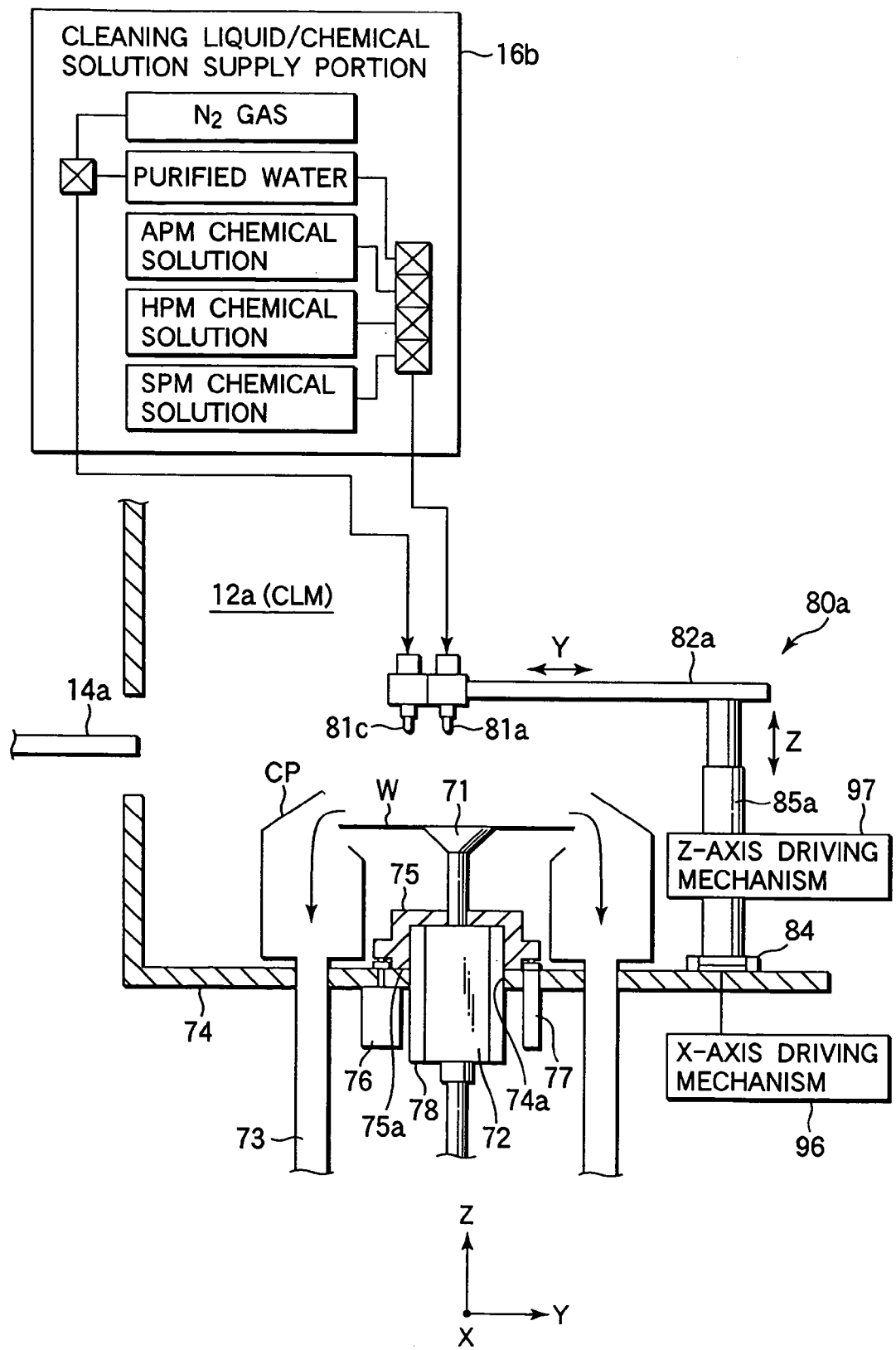
FIG. 7 is a sectional view schematically showing a cleaning/chemical-solution processing unit (CLM) disposed in the removing apparatus.

FIG. 7 is a sectional view schematically showing the cleaning/chemical-solution processing unit (CLM) 12a disposed in the removing apparatus 102.

The cleaning/chemical-solution processing unit (CLM) 12a includes an annular cup CP disposed at the center, and a spin chuck 71 disposed inside the cup (CP). The spin chuck 71 is arranged to fix and hold a wafer W by means of vacuum suction, and to be rotated by a drive motor 72 in this state. A drain 73 is disposed at the bottom of the cup (CP) to exhaust the chemical solution and purified water.

The drive motor 72 is disposed to be movable up and down in an opening 74a formed in the unit bottom plate 74. The drive motor 72 is coupled with an elevating mechanism 76, such as an air cylinder, and a vertical guide 77 through a cap-like flange member 75. The drive motor 72 is provided with a cylindrical cooling jacket 78 attached on its side. The flange member 75 is attached to cover the upper half of the cooling jacket 78.

When a chemical solution or the like is supplied onto a wafer W, the lower end 75a of the flange member 75 comes into close contact with the unit bottom plate 74 near the rim of the opening 74a to make the unit interior airtight. When a wafer W is transferred between the spin chuck 71 and wafer transfer arm 14a, the drive motor 72 and spin chuck 71 are moved up by the elevating mechanism 76, so that the lower end of the flange member 75 is separated upward from the unit bottom plate 74.

A cleaning liquid/chemical solution supply mechanism 80a is disposed outside the cup (CP) of the cleaning/chemical-solution processing unit (CLM) 12a, and is arranged to selectively supply purified water and chemical solutions from the cleaning liquid/chemical solution supply portion 16b of the chemical station 5 onto a resist film on a wafer W held by the spin chuck 71. A gas supply mechanism (not shown) for spraying a drying gas onto a wafer W is further disposed outside the cup (CP).

The cleaning liquid/chemical solution supply mechanism 80a includes a chemical solution delivery nozzle 81a, a spray nozzle 81c, a scan arm 82a, a vertical support member 85a, and an X-axis driving mechanism 96. The chemical solution delivery nozzle 81a is arranged to deliver a predetermined chemical solution, supplied from the cleaning liquid/chemical solution supply portion 16b, onto the surface of a wafer W held by the spin chuck 71. The spray nozzle 81c is arranged to spray purified water or a mixture of two fluids of purified water and nitrogen gas ($N_2$ gas), supplied from the cleaning liquid/chemical solution supply portion 16b, onto the surface of a wafer W. The scan arm 82a is arranged to hold the cleaning liquid delivery nozzle 81a and spray nozzle 81c, and to be movable back and forth in the Y-direction. The vertical support member 85a is arranged to support the scan arm 82a. The X-axis driving mechanism 96 is disposed on a guide rail 84 extending in the X-axis direction on the unit bottom plate 74, and is arranged to shift the vertical support member 85a in the X-axis direction.

The cleaning liquid/chemical solution supply portion 16b of the chemical station 5 can selectively supply an SPM chemical solution containing sulfuric acid and hydrogen peroxide solution, an APM chemical solution containing ammonia and hydrogen peroxide solution, an HPM chemical solution containing diluted hydrochloric acid and hydrogen peroxide solution, and purified water used as a rinsing liquid to the cleaning liquid delivery nozzle 81a. The cleaning liquid/chemical solution supply portion 16b can also supply purified water and $N_2$ gas to the spray nozzle 81c. The scan arm 82a is movable in the vertical direction (Z-direction) by a Z-axis driving mechanism 97 disposed on the vertical support member 85a, so that the cleaning liquid delivery nozzle 81a and spray nozzle 81c can be moved to an arbitrary position above a wafer W, and retreated to a predetermined position outside the cup (CP).

The gas supply mechanism (not shown) is connected to the gas supply portion 16a of the chemical station 5, and is arranged to supply a drying gas, such as nitrogen gas, from the gas supply portion 16a onto the surface of the wafer W.

Next, an explanation will be given of a resist film removing method using the substrate processing system 100 according to this embodiment.

At first, a wafer W in a state shown in FIG. 1A is transferred into the coating apparatus 101 shown in FIG. 2. In the coating apparatus 101, as shown in FIG. 1B, a protection film 64 is formed on the wafer W by spin coating (Step 1).

The wafer W with the protection film 64 formed thereon is transferred by a transfer unit (not shown) into the removing apparatus 102. In the removing apparatus 102, the wafer W is transferred by the wafer transfer arm 14a from the wafer mount unit (TRS) 13b into one of the hot plate units (HP) 19a to 19d, e.g., the hot plate unit (HP) 19a. Then, the wafer W is heated by the hot plate unit (HP) 19a to cause popping in a resist film 63', as shown in FIG. 1C (Step 2). The temperature of the wafer W heated by the hot plate unit (HP) 19a is set to be higher than the temperature of a heating process performed subsequently to the development process of the resist film 63, as described above.

After the resist film 63' is subjected to sufficient popping, the wafer W is transferred by the wafer transfer arm 14a from the hot plate unit (HP) 19a into one of the denaturing units (VOS) 15a to 15h, e.g., the denaturing unit (VOS) 15a. In this transfer of the wafer W, the lid 41b of the chamber 30 is first retreated above the lower container 41a. In this state, the wafer transfer arm 14a that holds the wafer W is moved forward such that the wafer W is inserted at a position slightly higher than the portions for supporting the wafer W in the hook members 46 attached to the lid 41b (portions extending in the horizontal direction). Then, the wafer transfer arm 14a is moved down to transfer the wafer W onto the hook members 46.

After the wafer transfer arm 14a is retreated from the chamber 30, the lid 41b is moved down to bring the lid 41b into close contact with the lower container 41a. Further, the projecting portions 47a and 47b respectively disposed on end sides of the lower container 41a and lid 41b are pinched and clamped by the rollers 59a and 59b to set the chamber 30 in an airtight state. When the lid 41b is moved down, the wafer W is transferred from the hook members 46 onto the proximity pins 44 on the way.

After the chamber 30 is set airtight, the heaters 45a and 45b heat and maintain the stage 33 and lid 41b at predetermined temperatures. When the stage 33 and lid 41b are set at predetermined temperatures, and the temperature distribution of the wafer W becomes essentially uniform, an ozone-containing gas is first solely supplied from the gas supply portion 16a (see FIGS. 3 and 5) through the gas feed port 34a into the chamber 30. At this time, the ozone-containing gas is adjusted to purge the interior of the chamber 30 and set it at a predetermined positive pressure. Thereafter, a process gas prepared by mixing water vapor with the ozone-containing gas is supplied from the gas supply portion 16a through the gas feed port 34a into the chamber 30. With this process gas, the resist film 63' and the protection film 64 in a state shown in FIG. 1C are oxidized and denatured into a resist film 63" and a protection film 64', respectively, which are soluble in water, as shown in FIG. 1D (Step 3). The process gas is prepared such that the substrate 60 is not damaged by the gas, and, if any, polymer residues remaining on the silicon wafer 61 without suffering ion implantation are also denatured by the gas to be soluble in water.

When the denatured resist film 63" and protection film 64' soluble in water are formed, the supply of the process gas is stopped. Further, nitrogen gas is supplied from the process gas supply portion 16a through the gas feed port 34a into the chamber 30 to purge the interior of the chamber 30 with nitrogen gas. This purge process is performed to completely exhaust the ozone-containing gas from the exhaust unit 32, so that no ozone-containing gas flows from the exhaust unit 32 back into the chamber 30 and leaks out of the chamber 30 when the chamber 30 is opened thereafter.

When the nitrogen gas purge process is finished, it is confirmed that the inner pressure and external pressure of the chamber 30 are the same. Then, the rollers 59a and 59b are operated to break up the clamping force applied to the lower container 41a and lid 41b. Then, the lid 41b is moved up along with the wafer W held on the hook members 46. Then, the wafer transfer arm 14a is inserted into the gap between the lower container 41a and lid 41b, so that the wafer W is transferred from the hook members 46 onto the wafer transfer arm 14a.

After the wafer W is subjected to the denaturing process by the denaturing unit (VOS) 15a, the wafer W is transferred by the wafer transfer arm 14a to one of the cleaning/chemical-solution processing units (CLM) 12a to 12d, e.g., the cleaning/chemical-solution processing unit (CLM) 12a, in which a cleaning process is performed.

Specifically, at first, the wafer W is placed by the wafer transfer arm 14a onto the spin chuck 71 of the cleaning/chemical-solution processing unit (CLM) 12a and is held thereon by means of vacuum suction. Then, while the spin chuck 71 is rotated along with the wafer W held thereon, purified water is supplied from the cleaning liquid/chemical solution supply portion 16b through the spray nozzle 81c onto the wafer W. Consequently, as shown in FIG. 1E, the resist film 63" and protection film 64' are dissolved and removed from the wafer W (Step 4).

After the resist film 63" and protection film 64' are removed, the APM chemical solution is supplied from the cleaning liquid/chemical solution supply portion 16b through the chemical solution delivery nozzle 81a onto the wafer W. Further, a mixture of two fluids of purified water and $N_2$ gas is also supplied from the cleaning liquid/chemical solution supply portion 16b through the spray nozzle 81c onto the wafer W. Consequently, particles generated on the wafer W are removed. Then, the HPM chemical solution is supplied from the cleaning liquid/chemical solution supply portion 16b through the chemical solution delivery nozzle 81a onto the wafer W to remove metal contaminants from the wafer W. Subsequently, purified water is supplied from the cleaning liquid/chemical solution supply portion 16*b* through the spray nozzle 81*c* onto the wafer W to perform a water washing process (rinsing process) on the wafer W. Then, the spin chuck 71 is rotated at a higher speed to perform spin-drying of the wafer W.

After the process in the cleaning/chemical-solution processing unit (CLM) 12*a* is finished, the wafer W is transferred by the wafer transfer arm 14*a* to one of the hot plate units (HP) 19*a* to 19*d* to heat and dry the wafer W, as needed. Then, the wafer W is transferred into the wafer mount unit (TRS) 13*a*, and further transferred therefrom by the wafer transfer unit 7 to a predetermined position in a carrier C.

In the case where Step 3*b* is performed in place of Steps 3 and 4 after Step 2, a wafer W with an after-popping resist film 63' formed thereon is transferred by the wafer transfer arm 14*a* from the hot plate unit (HP) 19*a* to the cleaning/chemical-solution processing unit (CLM) 12*a* without passing through the denaturing unit (VOS) 15*a*.

In this case, at first, the wafer W is held on the spin chuck 71 of the cleaning/chemical-solution processing unit (CLM) 12*a* by means of vacuum suction. Then, while the spin chuck 71 is rotated along with the wafer W held thereon, the SPM chemical solution is supplied from the cleaning liquid/chemical solution supply portion 16*b* through the chemical solution delivery nozzle 81*a* onto the wafer W. Consequently, the resist film 63" and protection film 64' are dissolved and removed from the wafer W (Step 3*b*). After the resist film 63" and protection film 64' are removed, the step of supplying the APM chemical solution and the mixture of two fluids, the step of supplying the HPM chemical solution, the step of supplying purified water, and the step of spin-drying are sequentially performed.

Next, an explanation will be given of a resist film removing method according to an alternative embodiment of the present invention, along with a method performed by the substrate processing system 100.

FIGS. 8A to 8E are views schematically showing steps of a resist film removing method according to this alternative embodiment of the present invention.

Figure 8A:
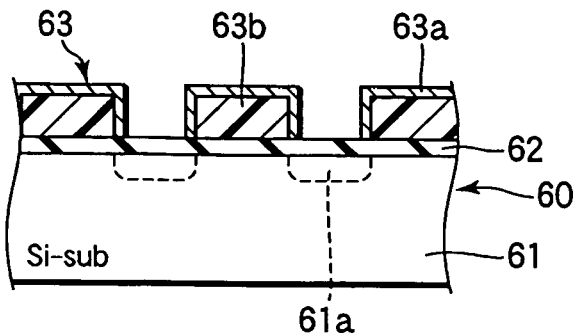
FIGS. 8A to 8E are views schematically showing steps of a resist film removing method according to an alternative embodiment of the present invention.
Figure 8B:
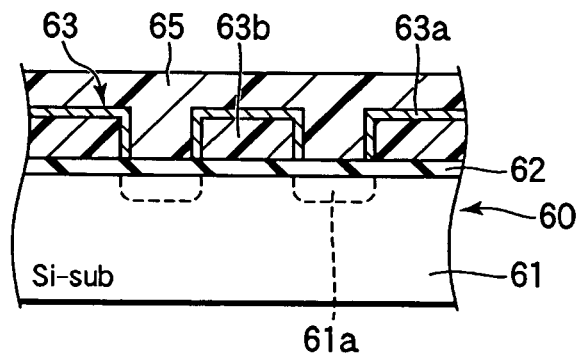

FIG. 8A shows the same state as that shown in FIG. 1A, and thus is provided with the same reference symbols to omit their explanation. In this embodiment, when the resist film 63 is removed, as shown in FIG. 8B, a shrink material 65 is formed on the surface of the resist film 63 to cover the surface of the substrate 60, for example (Step 1'). The shrink material 65 is made of a thermally shrinkable resin material, such as SAFIER (registered TM). The shrink material 65 is preferably formed to be as thin as possible, so as to be easily removed, but needs to have a film thickness that can apply a sufficient compressive stress and/or tensile stress to the cured layer 63*a* of the resist film 63 when it is shrunk by heating. In the substrate processing system 100, Step 1' is performed by spin coating in the coating apparatus 101, as in Step 1.

Figure 8C:
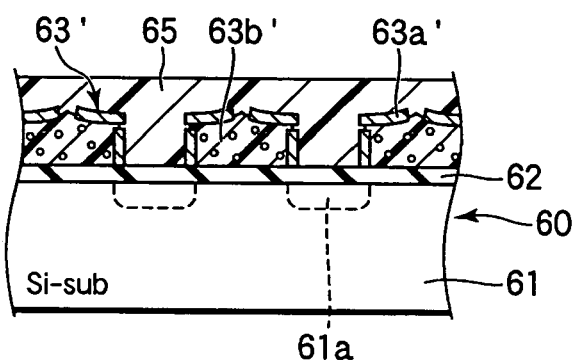

Then, as shown in FIG. 8C, the shrink material 65 is shrunk by heating, so as to apply a compressive stress and/or tensile stress to the cured layer 63*a* of the resist film 63, thereby generating cracks in the cured layer 63*a* of the resist film 63 (Step 2'). Reference symbols 63', 63*a'*, and 63*b'* indicate the resist film, cured layer, and non-cured part, respectively, obtained after the cracks are generated by heating. At this time, if the resist film 63 is heated at a temperature higher than that of a heating process (post baking) following the development process to cause popping in the resist film 63, more cracks can be generated in the cured layer 63*a* of the resist film 63 (FIG. 8C shows a state where popping has been caused in the resist film, as well). In this case, the shrink material 65 is preferably formed in Step 1' to have a film thickness that can prevent droplets of the resist film 63 from bursting therethrough. In the substrate processing system 100, Step 2' is performed by one of the hot plate units (HP) 19*a* to 19*d*, as in Step 2.

Figure 8D:
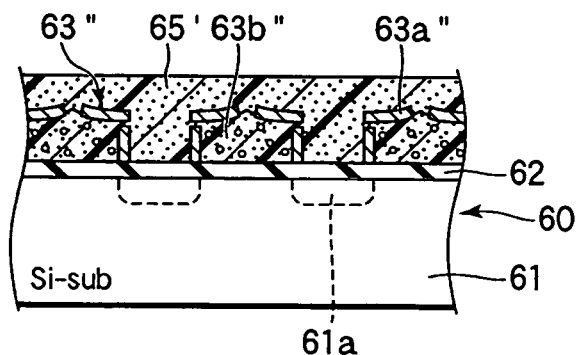

Subsequently, as shown in FIG. 8D, a process gas containing water vapor and ozone is supplied and brought into contact with the resist film 63' and shrink material 65 after the cracks are generated, so that the resist film 63' and shrink material 65 are denatured to be soluble in water (Step 3'). Reference symbols 63", 63*a"*, 63*b"*, and 65' indicate the resist film, cured layer, non-cured part, and shrink material, respectively, obtained after they are denatured to be soluble in water. In the substrate processing system 100, Step 3' is performed by one of the denaturing units (VOS) 15*a* to 15*h*, as in Step 3.

Figure 8E:
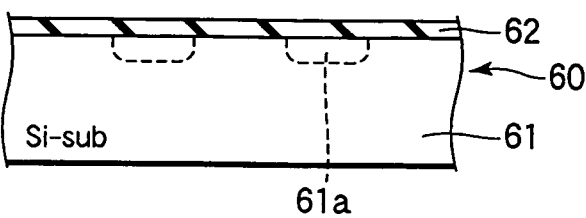

Then, as shown in FIG. 8E, the resist film 63" and shrink material 65' denatured to be soluble in water are dissolved and removed from the substrate 60 by purified water cleaning (Step 4'). In place of purified water, another aqueous cleaning liquid or organic solvent may be used to remove the resist film 63" and shrink material 65'. In the substrate processing system 100, Step 4' is performed by one of the cleaning/chemical-solution processing units (CLM) 12*a* to 12*d*, as in Step 4. Thereafter, as described above, the step of supplying the APM chemical solution and the mixture of two fluids, the step of supplying the HPM chemical solution, the step of supplying purified water, and the step of spin-drying are sequentially performed.

As described above, unlike the conventional resist film removing method, this embodiment does not utilize ashing, such as plasma ashing, so the substrate 60 is prevented from being damaged. Further, thermal shrinkage of the shrink material 65 covering the resist film 63 is utilized to generate cracks in the cured layer 63*a* of the resist film 63, and popping is caused in the resist film 63 while it is covered with the shrink material 65. Consequently, the cured layer 63*a* of the resist film 63 can be broken more widely, while droplets of the non-cured part 63*b* of the resist film 63 are prevented from being scattered onto the substrate 60. In addition, even after the cracks are generated, the non-cured part 63*b'* is prevented by the shrink material 65 from coming into contact with the atmosphere, and thereby prevented from being cured. Accordingly, after the cracks are generated, the process gas is allowed to permeate into the resist film 63' up to the boundary between the resist film 63' and substrate 60, and to thereby denature the resist film 63' into the water soluble resist film 63". Then, the resist film 63" can be completely removed from the substrate 60 by the subsequent purified water cleaning.

After Step 2', in place of Steps 3' and 4', an SPM chemical solution containing sulfuric acid and hydrogen peroxide solution may be used to remove the resist film 63' and shrink material 65 from the substrate 60 after the cracks are generated (Step 3*b'*). Also in this case, after the cracks are generated, the SPM chemical solution is allowed to permeate into the resist film 63' up to the boundary between the resist film 63' and substrate 60, so the resist film 63' can be completely removed from the substrate 60. In the substrate processing system 100, Step 3*b'* is performed by one of the cleaning/chemical-solution processing units (CLM) 12*a* to 12*d*, as in Step 3*b*.

Next, an explanation will be given of a resist film removing method according to a further alternative embodiment of the present invention, along with a method performed by the substrate processing system 100.

FIGS. 9A to 9E are views schematically showing steps of a resist film removing method according to this alternative embodiment of the present invention.

Figure 9A:
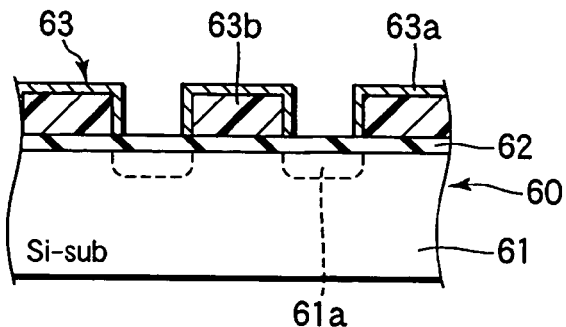
FIGS. 9A to 9E are views schematically showing steps of a resist film removing method according to a further alternative embodiment of the present invention.
Figure 9B:
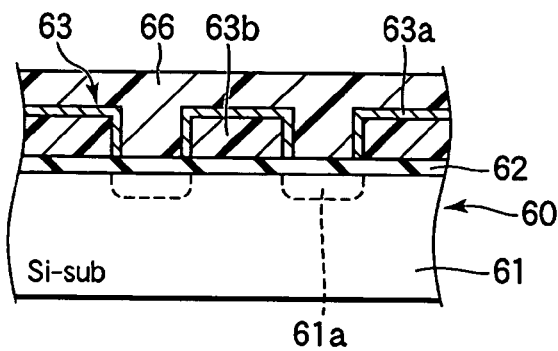

FIG. 9A shows the same state as that shown in FIG. 1A, and thus is provided with the same reference symbols to omit their explanation. In this embodiment, when the resist film 63 is removed, as shown in FIG. 9B, a softening material 66 is formed on the surface of the resist film 63 to cover the surface of the substrate 60, for example (Step 1"). The softening material 66 is made of a resin material, such as AZ RELACS (a brand name of AZ Electronic Materials Co. Ltd.), which has a property such that, when it is in contact with the cured layer 63a of the resist film 63 and heated, it reacts with an acid generated from the cured layer 63a and forms a cross-linkage, thereby softening the cured layer 63a. The softening material 66 is preferably formed to be as thin as possible, so as to be easily removed, but needs to have a film thickness that can realize a sufficient reaction with an acid generated from the cured layer 63a of the resist film 63 when it is heated. In the substrate processing system 100, Step 1" is performed by spin coating in the coating apparatus 101, as in Step 1.

Figure 9C:
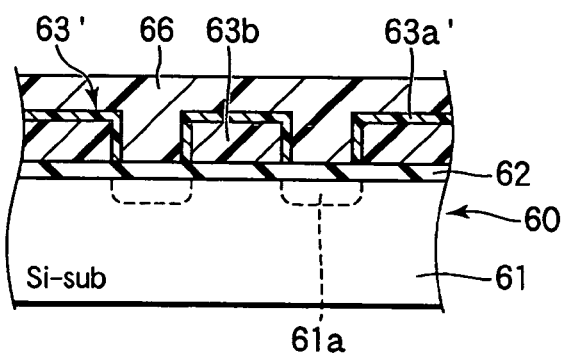

Then, as shown in FIG. 9C, the softening material 66 is heated and caused to react with an acid generated from the cured layer 63a of the resist film 63, thereby softening the cured layer 63a (Step 2"). Reference symbols 63' and 63a' indicate the resist film and cured layer, respectively, obtained after the softening. In the substrate processing system 100, Step 2" is performed by one of the hot plate units (HP) 19a to 19d, as in Step 2.

Figure 9D:
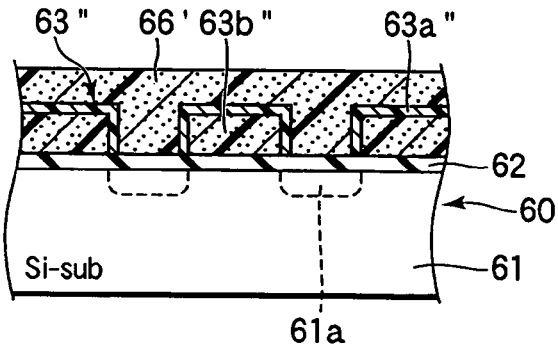

Subsequently, as shown in FIG. 9D, a process gas containing water vapor and ozone is supplied and brought into contact with the resist film 63' and softening material 66 after the softening, so that the resist film 63' and softening material 66 are denatured to be soluble in water (Step 3"). Reference symbols 63", 63a", 63b", and 66' indicate the resist film, cured layer, non-cured part, and softening material, respectively, obtained after they are denatured to be soluble in water. In the substrate processing system 100, Step 3" is performed by one of the denaturing units (VOS) 15a to 15h, as in Step 3.

Figure 9E:
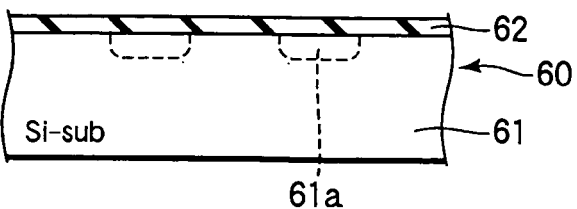

Then, as shown in FIG. 9E, the resist film 63" and softening material 66' denatured to be soluble in water are dissolved and removed from the substrate 60 by purified water cleaning (Step 4"). In place of purified water, another aqueous cleaning liquid or organic solvent may be used to remove the resist film 63" and softening material 66'. In the substrate processing system 100, Step 4" is performed by one of the cleaning/chemical-solution processing units (CLM) 12a to 12d, as in Step 4. Thereafter, as described above, the step of supplying the APM chemical solution and the mixture of two fluids, the step of supplying the HPM chemical solution, the step of supplying purified water, and the step of spin-drying are sequentially performed.

As described above, unlike the conventional resist film removing method, this embodiment does not utilize ashing, such as plasma ashing, so the substrate 60 is prevented from being damaged. Further, the softening material 66 that can soften the cured layer 63a of the resist film 63 is utilized to cover the resist film 63 and to soften the cured layer 63a. In this case, the liquid permeability of the surface of the resist film 63 is improved without scattering the non-cured part 63b inside the resist film 63. Accordingly, after the softening, the process gas is allowed to permeate into the resist film 63' up to the boundary between the resist film 63' and substrate 60, and to thereby denature the resist film 63' into the water soluble resist film 63". Then, the resist film 63" can be completely removed from the substrate 60 by the subsequent purified water cleaning.

After Step 2", in place of Steps 3" and 4", an SPM chemical solution containing sulfuric acid and hydrogen peroxide solution may be used to remove the resist film 63' and softening material 66 from the substrate 60 after the softening (Step 3b"). Also in this case, after the softening, the SPM chemical solution is allowed to permeate into the resist film 63' up to the boundary between the resist film 63' and substrate 60, so the resist film 63' can be completely removed from the substrate 60. In the substrate processing system 100, Step 3b" is performed by one of the cleaning/chemical-solution processing units (CLM) 12a to 12d, as in Step 3b.

The present invention is not limited to the embodiments described above, and it may be modified in various manners. For example, the embodiments described above are exemplified by a case where a resist film cured by ion implantation is removed, but this is not limiting. The present invention may be applied to any process in which a resist film having a cured layer at the surface is removed. Further, in the embodiments described above, the substrate is exemplified by a silicon wafer, but this is not limiting. The substrate may be a glass substrate or ceramic substrate. Furthermore, in the embodiments described above, the resist film and protection film (or shrink material, or softening material) are together subjected to the denaturing process, cleaning process, and chemical solution process. Alternatively, these films may be separately subjected to the processes.

What is claimed is:

1. A computer readable storage medium that stores a control program for execution on a computer, wherein the control program, when executed, causes the computer to control a processing apparatus to conduct a resist film removing method for removing a resist film disposed on a substrate and having a cured layer at a surface, the method comprising:
    covering the surface of the resist film with a protection film;
    causing popping in the resist film covered with the protection film, thereby breaking the cured layer, while leaving the resist film covered with the protection film and preventing droplets of the resist film generated by said popping from bursting through the protection film; and
    removing both of the resist film and the protection film together from the substrate by a predetermined liquid after said step of causing popping.

2. The computer readable storage medium according to claim 1, wherein said removing the resist film and the protection film comprises denaturing the resist film and the protection film after said causing popping, to be soluble in water or an organic solvent, and then dissolving the resist film and the protection film by water or the organic solvent.

3. The computer readable storage medium according to claim 2, wherein a process using a process gas containing water vapor and ozone is performed on the resist film and the protection film in said denaturing the resist film and the protection film after said causing popping.

4. The computer readable storage medium according to claim 3, wherein the process using a process gas containing water vapor and ozone is performed in a state where the substrate is placed in an airtight chamber and a positive pressure is maintained inside the airtight chamber.

5. The computer readable storage medium according to claim 1, wherein the protection film comprises an elastic resin.

6. The computer readable storage medium according to claim 1, wherein the cured layer is a layer formed by ion implantation.

7. A computer readable storage medium that stores a control program for execution on a computer, wherein the control program, when executed, causes the computer to control a processing apparatus to conduct a resist film removing method for removing a resist film disposed on a substrate, the resist film having been subjected to a light exposure process, a development process, a heating process, and an ion implantation process in this order, and having a cured layer formed at a surface thereof by the ion implantation process, the method comprising:

covering the surface of the resist film with a protection film consisting essentially of an elastic resin;

heating the resist film covered with the protection film at a temperature higher than that of the heating process, thereby causing popping in the resist film and breaking the cured layer by said popping, while leaving the resist film covered with the protection film and preventing droplets of the resist film generated by said popping from bursting through the protection film; and dissolving the resist film and the protection film by a predetermined liquid after said step of popping, thereby removing both of the resist film and the protection film together from the substrate.

8. The computer readable storage medium according to claim 7, wherein the method further comprises:

a step of denaturing the resist film and the protection film to be soluble in the predetermined liquid, which is water or an organic solvent, between said step of popping and dissolving.

9. The computer readable storage medium according to claim 8, wherein said denaturing comprises processing the resist film and the protection film by a process gas containing water vapor and ozone.

10. The computer readable storage medium according to claim 9, wherein said denaturing is performed in a state where the substrate is placed in an airtight chamber and a positive pressure is maintained inside the airtight chamber.

11. The computer readable storage medium according to claim 7, wherein the predetermined liquid for said dissolving is a chemical solution containing sulfuric acid and hydrogen peroxide solution.

12. The computer readable storage medium according to claim 7, wherein the elastic resin is a silicon-containing resist.

* * * * *